United States Patent
Hsu (10) Patent No.: US 9,518,327 B2
(45) Date of Patent: Dec. 13, 2016

(54) METAL STRIPPING ADDITIVE, COMPOSITION CONTAINING THE SAME, AND METHOD FOR STRIPPING METAL BY USING THE COMPOSITION

(71) Applicant: UWin Nanotech. Co., Ltd., New Taipei (TW)

(72) Inventor: Ching-Hsiang Hsu, New Taipei (TW)

(73) Assignee: UWIN NANOTECH, CO., LTD., New Taipei (TW)

( * ) Notice: Subject to any disclaimer, the term of this patent is extended or adjusted under 35 U.S.C. 154(b) by 0 days.

(21) Appl. No.: 14/972,790

(22) Filed: Dec. 17, 2015

(65) Prior Publication Data

US 2016/0102408 A1  Apr. 14, 2016

Related U.S. Application Data

(62) Division of application No. 13/957,976, filed on Aug. 2, 2013, now abandoned.

(30) Foreign Application Priority Data

Feb. 22, 2013 (TW) .............................. 102106178 A (51) Int. Cl.
 *B08B 3/04* (2006.01)
 *C11D 7/08* (2006.01)
 (Continued)

(52) U.S. Cl.
 CPC ............... *C23F 1/18* (2013.01); *C22B 11/046* (2013.01); *C22B 15/0063* (2013.01); *C22B 23/04* (2013.01); *C22B 25/04* (2013.01); *C22B 25/06* (2013.01); *C23F 1/16* (2013.01); *C23F 1/30* (2013.01); *H05K 3/22* (2013.01); *B08B 3/04* (2013.01); *B08B 3/044* (2013.01); *C23F 1/28* (2013.01); *H05K 2203/0789* (2013.01); *H05K 2203/178* (2013.01)

(58) Field of Classification Search
 CPC ............... C11D 7/02; C11D 7/06; C11D 7/08; C11D 7/10; C11D 7/12; C11D 7/16; B08B 3/04; B08B 3/044
 USPC ....... 510/245, 254, 269, 272, 508, 509, 510; 134/1.2, 1.3, 3
 See application file for complete search history.

(56) References Cited

U.S. PATENT DOCUMENTS

| | | | | |
|---|---|---|---|---|
| 5,264,046 A | * | 11/1993 | Winston | ................... C23G 1/20 134/2 |
| 5,391,234 A | * | 2/1995 | Murphy | ................... C09D 9/00 134/38 |

(Continued)

FOREIGN PATENT DOCUMENTS

TW  201247941 A  12/2012

*Primary Examiner* — Gregory R Delcotto
(74) *Attorney, Agent, or Firm* — Birch, Stewart, Kolasch & Birch, LLP (57) ABSTRACT

The present invention provides a metal stripping additive, composition containing the same, and method for stripping metal by using the composition. The metal stripping additive comprises a phosphate, a carbonate, and a component selected from at least one of citric acid or a derivative thereof, oxalate or a derivative thereof, malate or a derivative thereof. The metal stripping additive is used with nitric acid as the metal stripping composition of the present invention. The present method has advantages of being capable of stripping various metals, low corrosion, low toxicity, and being applicable under ambient temperature.

6 Claims, 8 Drawing Sheets

(51) Int. Cl.
*C11D 7/12* (2006.01)
*C11D 7/16* (2006.01)
*C23F 1/18* (2006.01)
*C23F 1/16* (2006.01)
*C23F 1/30* (2006.01)
*H05K 3/22* (2006.01)
*C22B 3/00* (2006.01)
*C22B 15/00* (2006.01)
*C22B 25/06* (2006.01)
*C23F 1/28* (2006.01)

(56) References Cited

U.S. PATENT DOCUMENTS

| | | | |
|---|---|---|---|
| 5,549,761 A * | 8/1996 | Winston | C11D 3/08 134/2 |
| 6,281,178 B1 | 8/2001 | Ryklin et al. | |
| 6,642,199 B2 * | 11/2003 | Humphreys | C22B 3/1625 134/3 |
| 6,703,358 B1 | 3/2004 | Aubay et al. | |
| 7,354,888 B2 | 4/2008 | Mostoller | |
| 7,671,001 B2 * | 3/2010 | Skee | C11D 3/0073 134/1.3 |
| 8,617,417 B2 | 12/2013 | Inaba et al. | |
| 8,846,594 B2 * | 9/2014 | Seita | C11D 3/042 134/22.1 |
| 2005/0043205 A1 | 2/2005 | Bettiol et al. | |
| 2005/0209117 A1 * | 9/2005 | Friedrich | C08G 73/0233 510/175 |
| 2006/0100119 A1 | 5/2006 | Smith | |
| 2006/0281655 A1 | 12/2006 | Stehr et al. | |
| 2007/0054832 A1 | 3/2007 | Hocking et al. | |
| 2009/0281015 A1 | 11/2009 | McRae et al. | |
| 2010/0294307 A1 | 11/2010 | Tyborski | |
| 2011/0107527 A1 | 5/2011 | De Buzzaccarini et al. | |
| 2011/0287997 A1 | 11/2011 | Busch et al. | |
| 2012/0053105 A1 | 3/2012 | Olson et al. | |
| 2015/0322545 A1 * | 11/2015 | Chen | H05K 3/22 75/744 |

* cited by examiner

METAL STRIPPING ADDITIVE, COMPOSITION CONTAINING THE SAME, AND METHOD FOR STRIPPING METAL BY USING THE COMPOSITION

RELATED APPLICATIONS

The application is a divisional of application Ser. No. 13/957,976 filed Aug. 2, 2013 which claims priority to Taiwan Application Serial Number TW 102106178, filed on Feb. 22, 2013, which is herein incorporated by reference.

BACKGROUND

1. Technical Field

The present invention is related to a metal stripping additive and composition containing the same; more particularly to a gold stripping additive and composition containing the same.

2. Description of Related Art

From ancient times, minerals are closely linked with the development of human society and science. Nowadays, their importance is even more in the electronic industry of modern technology. Various elements of electronic industry, such as a central processing unit, a printed circuit board, a memory, a flip chip, or even a concealed antenna equipped inside the outer shell of a mobile phone, contain metal-plated parts. In fact, those metal-plated parts play important roles in the device. However, minerals resources are not unlimited; therefore, under the sustainable development consideration, how to recycle the metal materials from those metal-plated parts has become a critical task in the industry.

Unlike most of the other metals, gold is an inert metal with highly stable chemical properties, therefore, it is not easy to strip it from waste products and there is only a few recycling methods are available. Aqua Regia method and cyanide method are the two gold-stripping methods used in the field.

Aqua regia is an acid liquid made by mixing concentrated nitric acid and concentrated hydrochloric acid at a volume ratio of 1:3. It is capable of dissolving most of the metal materials including gold. Aqua regia has extreme corrosion; therefore, even if the preparation thereof is easy, it still is not the dominant choice in the field under safety concern. Moreover, except for the metal-plated parts desired to be recycled, the substrate itself or other components of the electronic elements are also valuable. That said, it is not ideal because if aqua regia is used for recycling the metal material from waste electronic elements, the other components of the waste electronic elements will also be destroyed by the extreme corrosion property of aqua regia and fail to be recycled.

Cyanide method is the mostly used gold-stripping method in the field. Although cyanide does not have the disadvantage of harmful corrosion property as aqua regia does, it has high bio-toxicity that causes high risk in operation and storage. In addition, the waste liquid resulting from cyanide method contains a high concentration of cyanide. In order to comply with the environmental safety regulations, the waste liquid has to be diluted for at least 500 fold. This additional processing cost is also a burden for business.

Taiwanese Patent Publication No. 201247941 discloses a novel gold-stripping composition. Its components while operating with electrolysis method effectively strip gold from recycle materials. However, the application of the aforesaid gold-stripping composition is limited as some electronic elements adopt substrates with no conductivity.

In light of the foregoing, a metal-stripping composition being operating-friendly and able to be widely applied is in need in the field.

SUMMARY

One object of the present invention is to provide a metal-stripping additive, which has low corrosion, low toxicity and neutral pH value and is favorable for metal-stripping operation.

Another object of the present invention is to provide a metal-stripping composition, which is operating-friendly and is operable under room temperature.

More another object of the present invention is to provide a metal-stripping method, which is widely suitable for various kinds of metal and has better stripping rate.

In order to achieve the above objects, the present invention provides a metal stripping additive, comprising: 10 to 40 wt % of phosphate; 3 to 15 wt % of carbonate; and 5 to 15 wt % of a component selected from at least one of citric acid or a derivative thereof, oxalate or a derivative thereof, or malate or a derivative thereof.

Preferably, the metal stripping additive further comprises 5 to 30 wt % of a component selected from at least one of sodium hypochlorite or a derivative thereof, or pyridinesulfonic acid or a derivative thereof.

Preferably, said carbonate is sodium bicarbonate, potassium bicarbonate, sodium carbonate, or a combination thereof.

Preferably, said phosphate is monobasic potassium phosphate, dipotassium hydrogen phosphate, or a combination thereof.

Preferably, said citric acid or a derivative thereof is citric acid monohydrate, trisodium citrate monohydrate, or a combination thereof.

Preferably, the metal stripping additive comprises a component selected from at least one of boric acid, sulfate, metal chloride, nitrate, metal hydroxide.

Preferably, said sulfate is sodium sulfate, ammonium sulfate, potassium sulfate, or a combination thereof.

Preferably, said metal chloride is sodium chloride, ammonium chloride, potassium chloride, or a combination thereof.

Preferably, said nitrate is ammonium nitrate, potassium nitrate, sodium nitrate, or a combination thereof.

Preferably, said metal hydroxide is sodium hydroxide, potassium hydroxide, or a combination thereof.

Preferably, the metal stripping additive has a pH value of 6.5 to 8.0.

The present invention also provides a metal stripping composition, comprising: 40 to 60% (v/v) of nitric acid; and 40 to 60% (v/v) of the metal stripping additive.

Preferably, said nitric acid has a concentration of 60 to 70 wt %.

The present invention also provides a method for stripping metal, comprising the following steps: contacting an object to be processed with the metal stripping composition.

Preferably, said contacting is accomplished by immersing said object to be processed into said metal stripping composition.

Preferably, said contacting is accomplished at a temperature of 10° C. to 70° C.

Preferably, said contacting is accomplished in a time period of 10 sec to 900 sec.

Preferably, the method has a stripping rate of 0.01 μm/min to 0.2 μm/min.

Preferably, said object to be processed is an electronic element. Preferably, said electronic element is a central processing unit, a printed circuit board, a memory, a flip chip, a mobile phone, a combination thereof.

Preferably, said metal stripping additive and/or said metal stripping composition does not have cyanide, lead, cadmium, mercury, chromium(VI), or a combination thereof.

Preferably, said metal is gold, copper, nickel, tin, palladium, or a combination thereof.

Preferably, said metal stripping additive, said metal stripping composition, and/or said method has no harm to an object that made of silver, stainless steel, titanium, plastic, or a combination thereof.

To sum up, the present invention relates to a metal stripping additive for stripping various metals, a composition containing the same, and a method of using the composition. The additive of the present invention has neutral pH; therefore, is safer than the conventional methods in storage and operation. In addition, the method of the present invention can be operated under room temperature, and the time required is shorter than the conventional methods. All above features make the present invention more superior than the conventional methods.

DETAILED DESCRIPTION

In appreciate the insufficiency of the conventional metal stripping methods, the present invention provides a metal stripping additive and a composition containing the same. The present metal stripping composition is not only suitable for stripping gold but also suitable for stripping materials such as copper, nickel, tin, palladium; therefore is favorable for widely metal recycle process.

The metal stripping additive of the present invention comprises: 10 to 40 wt % of phosphate; 3 to 15 wt % of carbonate; and 5 to 15 wt % of a component selected from at least one of citric acid or a derivative thereof, oxalate or a derivative thereof, or malate or a derivative thereof. It is surprises that the aforesaid components while mixing at the aforesaid relative concentration results a metal stripping additive displaying superior metal stripping effect with nitric acid. Furthermore, the present metal stripping additive has a pH value which is at the neutral range of 6.5 to 8.0; therefore is safe in both of storage and operation.

In an alternative embodiment of the present invention, said carbonate is sodium bicarbonate, potassium bicarbonate, sodium carbonate, or a combination thereof; said phosphate is monobasic potassium phosphate, dipotassium hydrogen phosphate, or a combination thereof; said citric acid or a derivative thereof is citric acid monohydrate, trisodium citrate monohydrate, or a combination thereof.

In an alternative embodiment of the present invention, the present additive further comprises 5 to 30 wt % of a component selected from at least one of sodium hypochlorite or a derivative thereof, or pyridinesulfonic acid or a derivative thereof.

In a preferable embodiment of the present invention, the present additive comprises 10 to 40 wt % of monobasic potassium phosphate; 5 to 30 wt % of sodium hypochlorite; 3 to 15 wt % of sodium bicarbonate; and 5 to 15 wt % of citric acid monohydrate.

In an alternative embodiment of the present invention, the metal stripping additive may further comprise a component selected from at least one of boric acid, sulfate, metal chloride, nitrate, metal hydroxide. Alternatively, said sulfate is sodium sulfate, ammonium sulfate, potassium sulfate, or a combination thereof; said metal chloride is sodium chloride, ammonium chloride, potassium chloride, or a combination thereof. Said metal chloride is sodium chloride, ammonium chloride, potassium chloride, or a combination thereof. Said nitrate is ammonium nitrate, potassium nitrate, sodium nitrate, or a combination thereof. Said metal hydroxide is sodium hydroxide, potassium hydroxide, or a combination thereof.

The metal stripping composition of the present invention is formulated by the metal stripping additive and nitric acid. More specifically, the metal stripping composition of the present invention comprises: 40 to 60% (v/v) of nitric acid; and 40 to 60% (v/v) of the metal stripping additive. Alternatively, said nitric acid has a concentration of 60 to 70 wt %; preferably, said nitric acid is a commercial nitric acid having a concentration of 68 wt %.

In the preferable embodiment of the present invention, both of the metal stripping additive and the metal stripping composition does not have cyanide, lead, cadmium, mercury, chromium(VI) or a combination thereof. Therefore, they have no harm to the environment and to the health of the user while operation.

One of the features of the present metal stripping additive and/or the metal stripping composition is that it (or they) is useful in resolving or stripping the gold, copper, nickel, tin, palladium or a combination thereof on the object to be processed.

One of the features of the present metal stripping additive and/or the metal stripping composition is that it (or they) has no harm to the object made of silver, stainless steel, titanium, plastic, or a combination thereof. As used herewith, the term "no harm" means the present metal stripping additive and/or the metal stripping composition substantially do not dissolve or strip the object made of the aforesaid material.

One of the features of the present metal stripping additive and/or the metal stripping composition is that it (or they) contains no component that is adverse to organisms or the environment, such as, cyanide, lead, cadmium, mercury, or chromium(VI).

The present invention also provides a method for stripping metal, comprising the following steps: contacting an object to be processed with the metal stripping composition. More specifically, said object to be processed is, but not limited to central processing unit, printed circuit board, memory, flip chip, mobile phone, or a combination thereof.

Said contacting is accomplished by immersing said object to be processed into said metal stripping composition; more specifically, by immersing said object to be processed into a bath of said metal stripping composition in a container and letting the area containing the desired metal completely being immersed beneath said metal stripping composition.

By the disclosure of the present invention, those having ordinary skill in the art to which the present invention pertains can adjust the contacting time and temperature based on its practice. Preferably, the present method can be operated at a temperature of 10 to 70° C. Although higher temperature gives more rapid reaction rate, the present invention obtains good metal stripping efficiency under room temperature; therefore the present invention has the advantage that no heating is required.

Moreover, depending on the amount of the metal to be recycled, those having ordinary skill in the art can adjust the contacting time of the present invention according to the disclosure of the present invention. Taking gold as an example, the stripping rate of the present method is 0.01 to 0.2 μm/min. Generally, it only takes 10 to 900 sec. for contacting to accomplish the metal stripping process of the present method.

The metal stripping composition after processed dissolves the stripped metal, and the metal can be purified and isolated for other applications by the known manners (, that is, purification methods such as electrolysis, ion-exchange, etc.) in the field.

The following examples are used to demonstrate the experiments conducted in the research of the present invention for further displaying the features and advantages of the present invention. It shall be understood that the following embodiments are only exemplary and shall not limit the claimed scope of the present invention.

Embodiment 1: Test for Stripping Saturation of the Present Stripping Composition to Various Kinds of Metals The stripping additive according to the present invention used in this embodiment contained the following components: 40 weight percentage of monobasic potassium phosphate, 30 weight percentage of sodium hypochlorite, 15 weight percentage of sodium bicarbonate, and 15 weight percentage of citric acid monohydrate. The pH thereof was 7.4. The formulated stripping additive was mixed with a commercial nitric acid (68 wt %) by a volume ratio of 5:5 to obtain the metal stripping composition of the present invention.

Pure materials of various weight were respectively put into said metal stripping composition to test the solubility of different materials in said metal stripping composition. The materials tested in this embodiment were gold, copper, nickel, tin, silver, stainless steel, titanium, and plastic. The operation temperature was 30° C.

The maximum solubility of the present metal stripping composition to each material, that is, the stripping saturation desired to know, was obtained from the solubility of each material of different weight. The experimental result is listed in the following table 1.

TABLE 1 the maximum solubility (stripping saturation) of the metal stripping composition of the embodiment to various materials

| material | stripping saturation (g/L) |
|---|---|
| gold | 13.5 |
| copper | 140 |
| nickel | 170 |
| tin | 160 |
| silver | not dissolved |
| stainless steel | not dissolved |
| titanium | not dissolved |
| plastic | not dissolved |

According to the experimental results, the stripping saturation of the present metal stripping composition to gold, copper, nickel and tin was obtained, and it was noted that the present metal stripping composition has no solubility to silver, stainless steel, titanium, and plastic. That said, for example, if the present metal stripping composition is used to strip the gold layer plated on a plastic substrate, the present metal stripping composition has no harm to the plastic substrate.

Embodiment 2: Testing the Effect of the Present Stripping Composition by Using Recycle Materials The tests in this embodiment were conducted by the metal stripping composition formulated in the embodiment 1.

Experiment 1

Figure 1A:
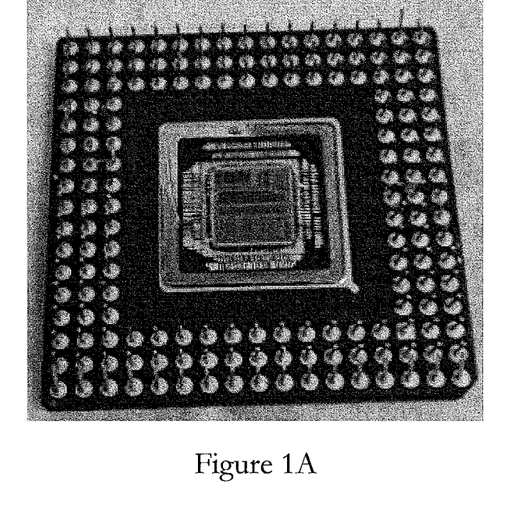
FIG. 1A shows a photo of a CPU before-treated recited in the experimental 1 of embodiment 2 of the present invention.
Figure 1B:
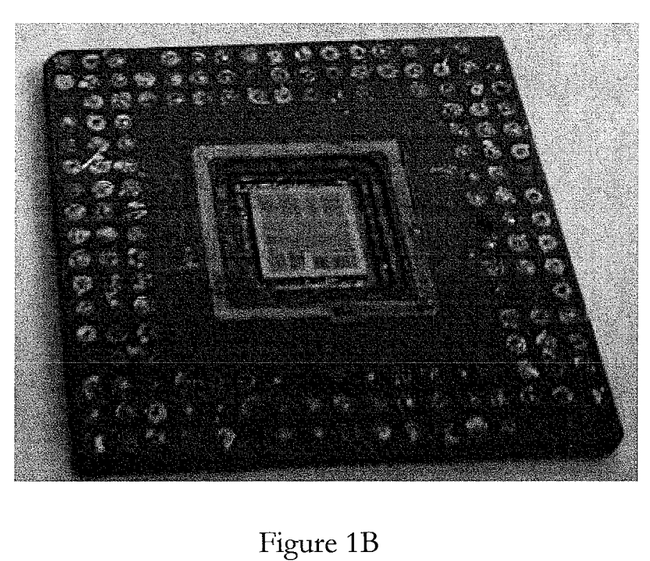
FIG. 1B shows a photo of a CPU after-treated recited in the experimental 1 of embodiment 2 of the present invention.

A CPU plated with a gold layer of 1.25 μm in thickness was obtained and immersed in the metal stripping composition of this embodiment. The treatment was continued at 30° C. for 12 minutes. FIG. 1A displayed the CPU before treated, and FIG. 1B displayed that after treated. According to the results shown in the figures, the present metal stripping composition had completely stripped the plated gold layer and had no harm to the CPU substrate.

Experiment 2

Figure 2A:
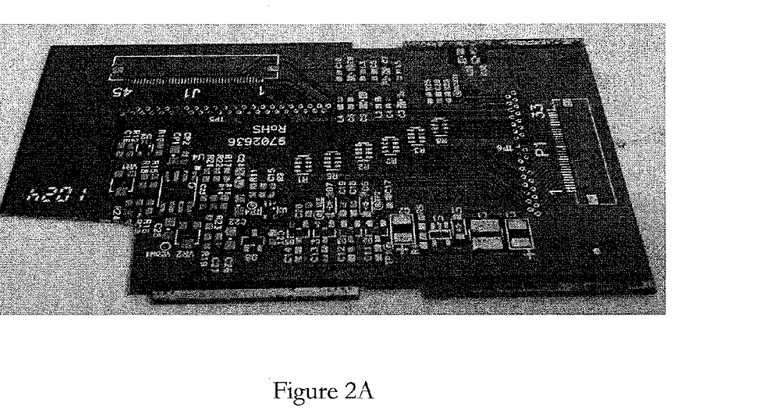
FIG. 2A shows a photo of a PCB before-treated recited in the experimental 2 of embodiment 2 of the present invention.
Figure 2B:
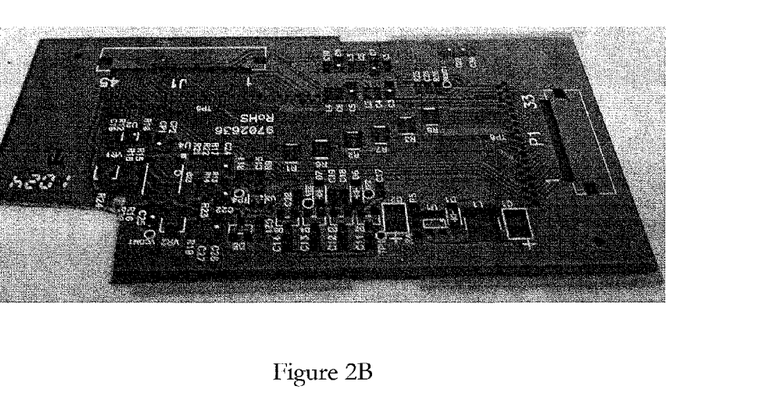
FIG. 2B shows a photo of a PCB after-treated recited in the experimental 2 of embodiment 2 of the present invention.

A PCB plated with a gold layer and a copper layer (both of them were 0.075 μm in thickness) was obtained and immersed in the metal stripping composition of this embodiment. The treatment was continued at 30° C. for 3 minutes. FIG. 2A displayed the PCB before treated, and FIG. 2B displayed that after treated. According to the results shown in the figures, the present metal stripping composition had completely stripped the plated gold layer and copper layer and had no harm to the PCB substrate.

Experiment 3

Figure 3A:
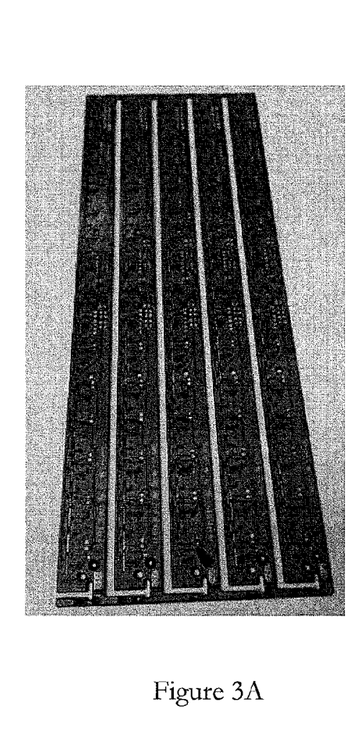
FIG. 3A shows a photo of a PCB before-treated recited in the experimental 3 of embodiment 2 of the present invention.
Figure 3B:
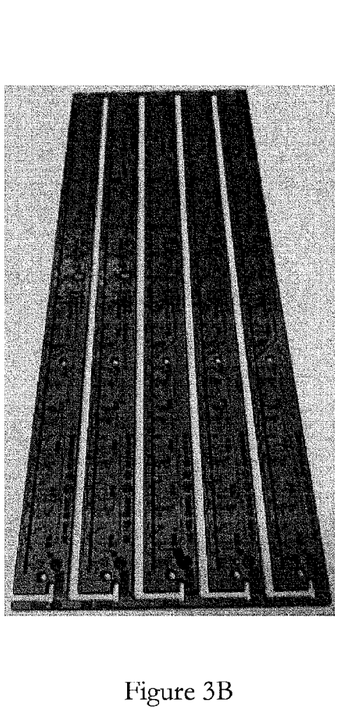
FIG. 3B shows a photo of a PCB after-treated recited in the experimental 3 of embodiment 2 of the present invention.

A PCB plated with a gold layer was obtained and immersed in the metal stripping composition of this embodiment. The treatment was continued at 30° C. for 7 minutes. FIG. 3A displayed the PCB before treated, and FIG. 3B displayed that after treated. According to the results shown in the figures, the present metal stripping composition had completely stripped the plated gold layer and had no harm to the PCB substrate.

Experiment 4

Figure 4A:
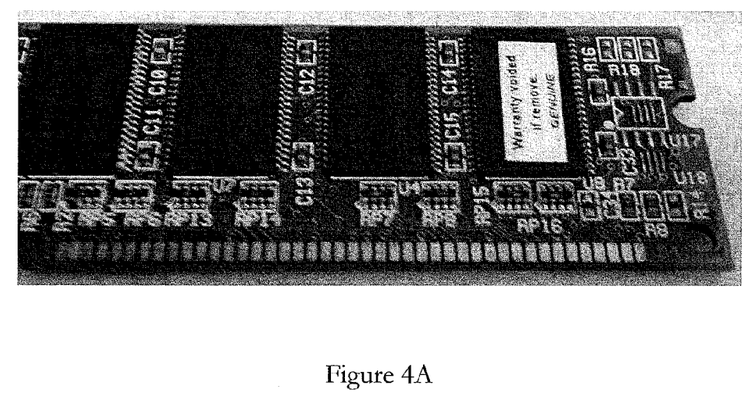
FIG. 4A shows a photo of a memory before-treated recited in the experimental 4 of embodiment 2 of the present invention.
Figure 4B:
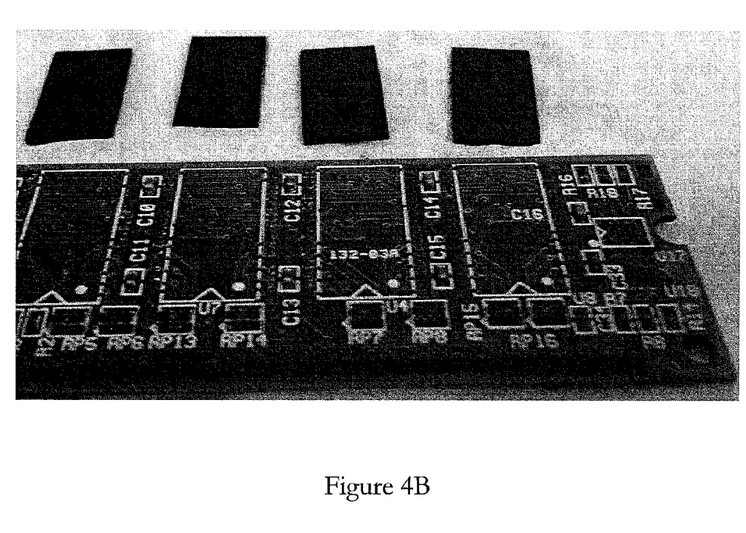
FIG. 4B shows a photo of a memory after-treated recited in the experimental 4 of embodiment 2 of the present invention.

A memory plated with a gold layer (gold fingers) was obtained and immersed in the metal stripping composition of this embodiment. The treatment was continued at 30° C. for 3 minutes. FIG. 4A displayed the memory before treated, and FIG. 4B displayed that after treated. According to the results shown in the figures, the present metal stripping composition had completely stripped the plated gold layer and had no harm to the substrate of the memory.

Experiment 5

Figure 5A:
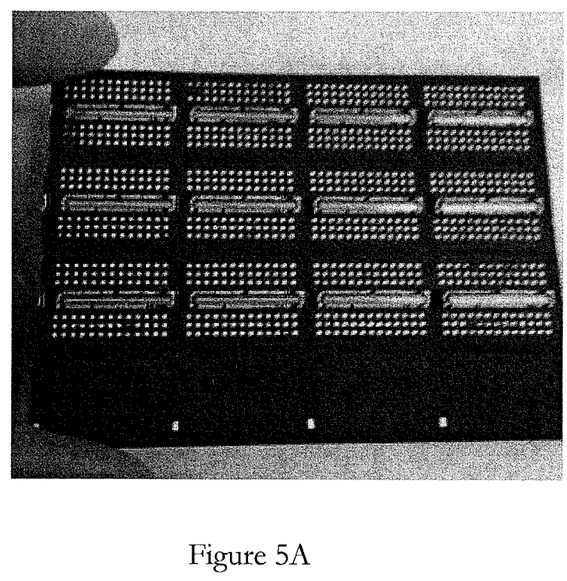
FIG. 5A shows a photo of a chip before-treated recited in the experimental 5 of embodiment 2 of the present invention.
Figure 5B:
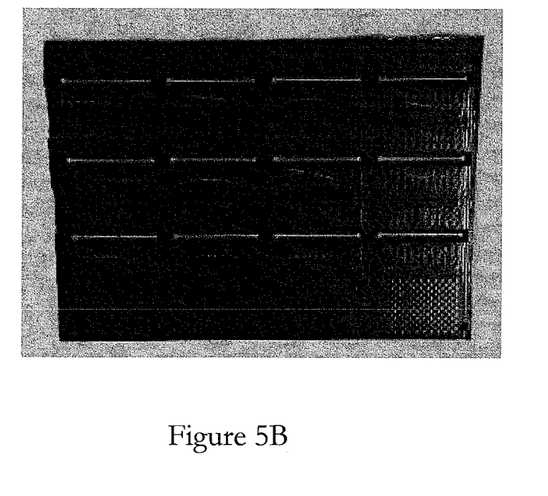
FIG. 5B shows a photo of a chip after-treated recited in the experimental 5 of embodiment 2 of the present invention.

A flip chip plated with a gold layer (gold fingers) was obtained and immersed in the metal stripping composition of this embodiment. The treatment was continued at 30° C. for 2 minutes. FIG. 5A displayed the flip chip before treated, and FIG. 5B displayed that after treated. According to the results shown in the figures, the present metal stripping composition had completely stripped the plated gold layer and had no harm to the substrate of the flip chip.

Experiment 6

Figure 6A:
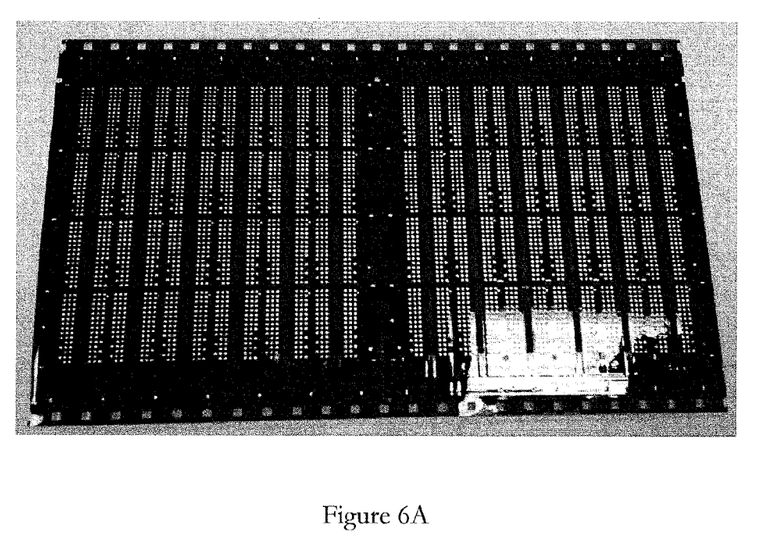
FIG. 6A shows a photo of a chip before-treated recited in the experimental 6 of embodiment 2 of the present invention.
Figure 6B:
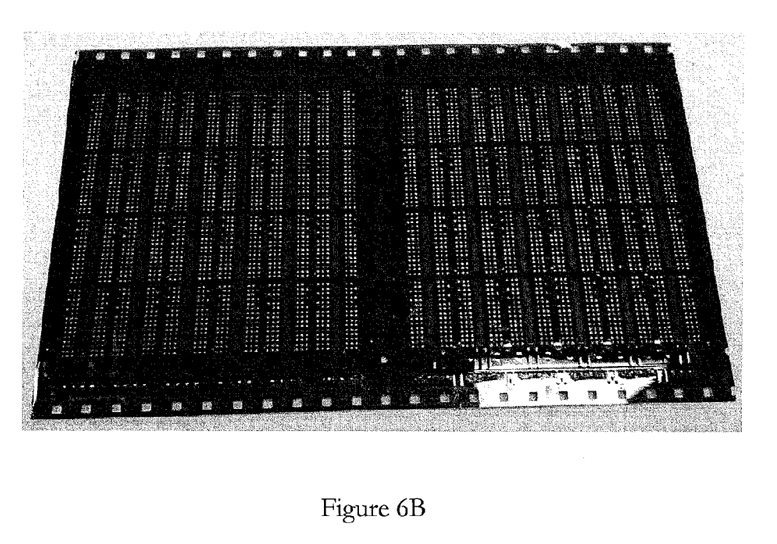
FIG. 6B shows a photo of a chip after-treated recited in the experimental 6 of embodiment 2 of the present invention.

A flip chip plated with a gold layer (gold fingers) was obtained and immersed in the metal stripping composition of this embodiment. The treatment was continued at 30° C. for 9 minutes. FIG. 6A displayed the flip chip before treated, and FIG. 6B displayed that after treated. According to the results shown in the figures, the present metal stripping composition had completely stripped the plated gold layer and had no harm to the substrate of the flip chip.

Experiment 7

Figure 7A:
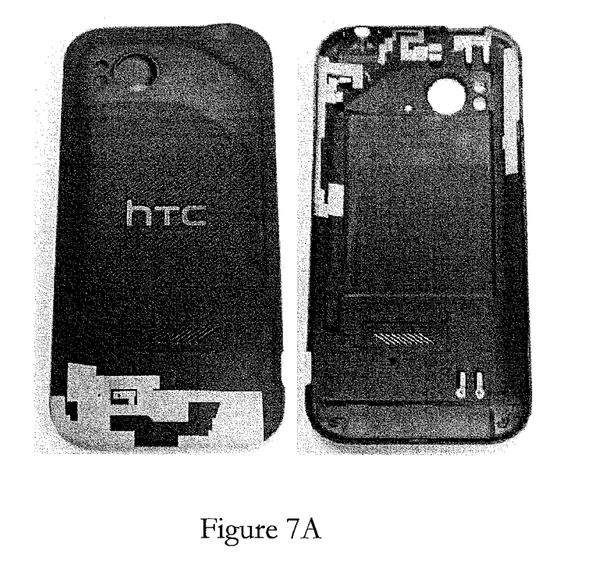
FIG. 7A shows a photo of an outer shell of a mobile phone before-treated recited in the experimental 7 of embodiment 2 of the present invention.
Figure 7B:
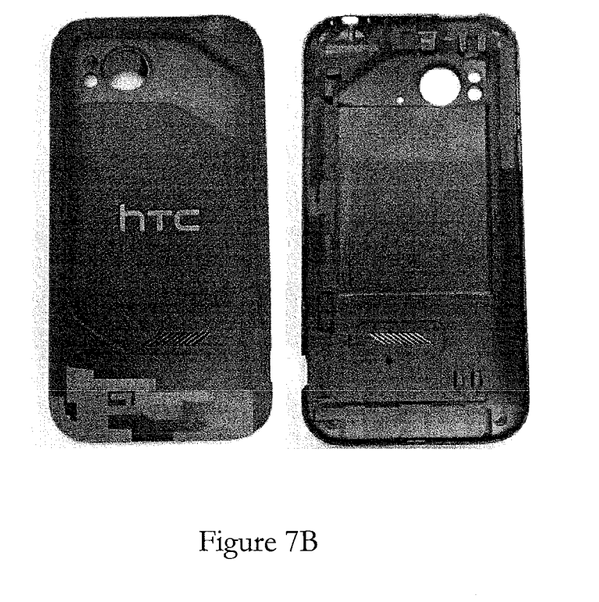
FIG. 7B shows a photo of an outer shell of a mobile phone after-treated recited in the experimental 7 of embodiment 2 of the present invention.

An outer shell of a mobile phone plated with a gold layer as a concealed antenna was obtained and immersed in the metal stripping composition of this embodiment. The treatment was continued at 30° C. for 90 sec. FIG. 7A displayed the shell before treated, and FIG. 7B displayed that after treated. According to the results shown in the figures, the present metal stripping composition had completely stripped the plated gold layer on the mobile phone shell and had no harm to the shell.

Experiment 8

Figure 8A:
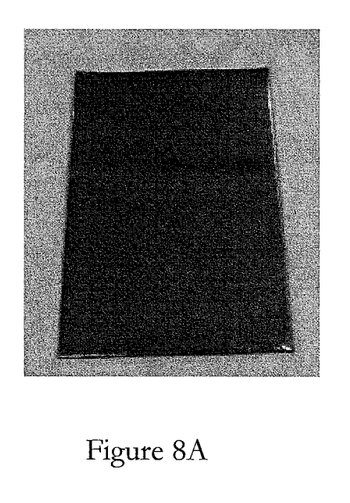
FIG. 8A shows a photo of a stainless steel before-treated recited in the experimental 8 of embodiment 2 of the present invention.
Figure 8B:
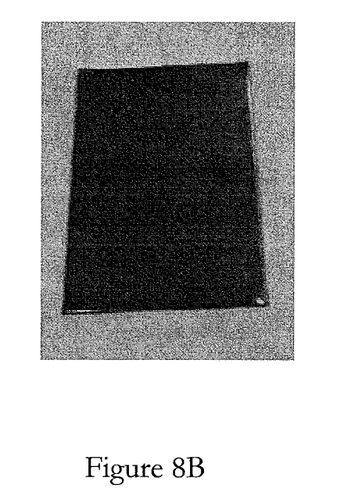
FIG. 8B shows a photo of a stainless steel after-treated recited in the experimental 8 of embodiment 2 of the present invention.

A stainless steel plate plated with a gold layer was obtained and immersed in the metal stripping composition of this embodiment. The treatment was continued at 30° C. for 60 sec. FIG. 8A displayed the plate before treated, and FIG. 8B displayed that after treated. According to the results shown in the figures, the present metal stripping composition had completely stripped the plated gold layer on the plate and had no harm to it.

The aforementioned experiments 1-8 showed that the present metal stripping composition is able to rapidly strip the gold or copper materials on an electronic element at room temperature and has no harm to other materials on the electronic element concerned. That said, except for the strippable materials on the electronic element, other recycling process can be conducted for other materials and the recycle value of waste products can be maximized.

Embodiment 3: Testing the Effect of the Present Stripping Composition at Various Operation Temperatures The tests in this embodiment were conducted by the metal stripping composition formulated in the embodiment 1.

Three PCBs plated with a gold layer of 0.075 μm in thickness were obtained and immersed in the metal stripping composition of this embodiment. The treatment was conducted at 10° C., 30° C., and 50° C., respectively. The time for completely stripping the gold layer was recorded and calculated into stripping rate defined as μm/min. The experimental results were listed in the following table 2.

TABLE 2

The stripping rate of the present metal stripping composition for gold layers at different operation temperatures.

| Temp. | stripping rate (μm/min) |
|---|---|
| 10° C. | 0.025 |
| 30° C. | 0.05 |
| 50° C. | 0.075 |

From the results recorded in the table, it was noted that the stripping rate of the present metal stripping composition was increased along with the raising temperature. If the user considers saving the heating cost, the present composition showed superior stripping rate at room temperature (30° C.). Furthermore, the present composition showed good stripping rate even at low operation temperature (10° C.), which means the present composition can still has good working efficiency at high latitude area.

Embodiment 4: Comparing the Efficiency Between the Metal Stripping Composition of the Present Invention and Conventional Methods The tests in this embodiment were conducted by the metal stripping composition formulated in the embodiment 1. Aqua regia and cyanide conventional in the field were also used as comparison.

Three PCBs plated with a gold layer of 0.075 μm in thickness were obtained and immersed respectively in the metal stripping composition of this embodiment, aqua regia, and cyanide. As the conventional method was required to be operated at 50☐, the experiment of this embodiment was conducted at 50° C. The time for completely stripping the gold layer was recorded and calculated into stripping rate defined as μm/min. The experimental results were listed in the following table 3.

TABLE 3

Comparing the efficiency between the metal stripping composition of the present invention and conventional methods.

| Stripping method | stripping rate (μm/min) |
|---|---|
| The present metal stripping composition | 0.05 |
| aqua regia | 0.005 |
| cyanide | 0.025 |

According to the aforesaid experimental results, the metal stripping composition of the present invention not only has no drawbacks of high corrosion and high toxicity, but also displayed stripping rate that far better than the conventional methods. It was obvious that the present composition is a better choice than conventional methods no matter in safety or working efficiency.

Those having ordinary skill in the art can understand various modifications according to the disclosed embodiments without departing from the spirit of the present invention. Therefore, the above-recited embodiments shall not be used to limit the present invention but shall intend to cover all modifications under the spirit and scope of the present invention along with the attached claims.

What is claimed is:

1. A method for stripping metal, comprising the following steps:

contacting an electronic element to be processed with a metal stripping composition;

wherein said metal stripping composition, comprising:
40 to 60% (v/v) of nitric acid; and
40 to 60% (v/v) of a metal stripping additive;
wherein said metal stripping additive, comprising:
10 to 40 wt % of phosphate, wherein said phosphate is monobasic potassium phosphate, dipotassium hydrogen phosphate, or a combination thereof;
3 to 15 wt % of carbonate, wherein said carbonate is sodium bicarbonate, potassium bicarbonate, sodium carbonate, or a combination thereof;
5 to 15 wt % of a component selected from at least one of citric acid or a derivative thereof, oxalate or a derivative thereof, or malate or a derivative thereof, wherein said citric acid or a derivative thereof is citric acid monohydrate, trisodium citrate monohydrate, or a combination thereof; and
5 to 30 wt % of a component selected from at least one of sodium hypochlorite or a derivative thereof, or pyridinesulfonic acid or a derivative thereof;
wherein said metal is gold, copper, nickel, tin, palladium, or a combination thereof;
wherein said composition has no harm to an object made of silver, stainless steel, titanium, plastic, or a combination thereof; and
wherein said electronic element is a central processing unit, a printed circuit board, a memory, a flip chip, a mobile phone, or a combination thereof.

2. The method according to claim 1, wherein said contacting is accomplished by immersing said electronic element to be processed into said metal stripping composition.

3. The method according to claim 1, wherein said contacting is accomplished at a temperature of 10° C. to 70° C.

4. The method according to claim 1, wherein said contacting is accomplished in a time period of 10 sec to 900 sec.

5. The method according to claim 1, having a stripping rate of 0.01 μm/min to 0.2 μm/min.

6. The method according to claim 1, wherein said metal stripping additive comprises 10 comprises 10 to 40 wt % of monobasic potassium phosphate; 5 to 30 wt % of sodium hypochlorite; 3 to 15 wt % of sodium bicarbonate; and 5 to 15 wt % of citric acid monohydrate.

* * * * *